(12) United States Patent
Majima (10) Patent No.: US 11,686,748 B2
(45) Date of Patent: Jun. 27, 2023

(54) CURRENT DETECTING CIRCUIT, CURRENT DETECTING SYSTEM, AND POWER SOURCE CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hideaki Majima, Minato Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 88 days.

(21) Appl. No.: 17/391,338

(22) Filed: Aug. 2, 2021

(65) Prior Publication Data

US 2022/0091163 A1 Mar. 24, 2022

(30) Foreign Application Priority Data

Sep. 24, 2020 (JP) .................. 2020-159320

(51) Int. Cl.
*G01R 19/165* (2006.01)
*H02M 1/08* (2006.01)
*H02M 1/00* (2006.01)
*H02M 7/06* (2006.01)

(52) U.S. Cl.
CPC .... *G01R 19/16576* (2013.01); *H02M 1/0009* (2021.05); *H02M 1/08* (2013.01); *H02M 7/06* (2013.01)

(58) Field of Classification Search
CPC .............. G01R 19/16576; H02M 1/0009; H02M 1/08; H02M 7/06; H03K 2217/0027
See application file for complete search history.

(56) References Cited

U.S. PATENT DOCUMENTS

| | | | |
|---|---|---|---|
| 9,431,908 B2 * | 8/2016 | Ho | H02M 3/1588 |
| 9,954,461 B1 | 4/2018 | Duvnjak | |
| 9,991,793 B2 | 6/2018 | Yamada et al. | |
| 10,135,357 B1 * | 11/2018 | Balakrishnan | H02M 3/3353 |
| 10,218,286 B2 | 2/2019 | Duvnjak | |
| 10,637,368 B2 | 4/2020 | Duvnjak | |

(Continued)

FOREIGN PATENT DOCUMENTS

| | | |
|---|---|---|
| JP | 2010-233439 A | 10/2010 |
| JP | 5800986 B2 | 10/2015 |

(Continued)

*Primary Examiner* — Kyle J Moody
(74) *Attorney, Agent, or Firm* — Allen & Overy LLP (57) ABSTRACT

According to an embodiment, a current detecting circuit includes: a normally-OFF type second switching element that is cascode-connected to a normally-ON type first switching element that includes a drain for outputting an output current; a normally-OFF type third switching element that is connected in parallel to the second switching element and whose drain is connected to a variable current source; and a comparison circuit that outputs a detection signal in accordance with a comparison result between a drain voltage of the second switching element and a drain voltage of the third switching element.

20 Claims, 8 Drawing Sheets

(56) References Cited

U.S. PATENT DOCUMENTS

| | | |
|---|---|---|
| 10,924,028 B2 | 2/2021 | Duvnjak |
| 11,444,545 B2 | 9/2022 | Duvnjak |
| 11,569,810 B2 * | 1/2023 | Majima ............... H03F 3/45179 |
| 2006/0028192 A1 * | 2/2006 | Ryu ..................... H02M 3/156 |
| | | 323/312 |
| 2010/0226149 A1 | 9/2010 | Masumoto |
| 2015/0061752 A1 | 3/2015 | Abe |
| 2018/0358904 A1 | 12/2018 | Duvnjak |
| 2019/0149062 A1 | 5/2019 | Duvnjak |
| 2020/0209287 A1 * | 7/2020 | Majima ............ H03K 17/08122 |
| 2020/0220476 A1 | 7/2020 | Duvnjak |
| 2021/0067153 A1 * | 3/2021 | Majima ................... G05F 1/573 |
| 2021/0211065 A1 | 7/2021 | Duvnjak |
| 2022/0091163 A1 * | 3/2022 | Majima ............... H02M 1/0009 |
| 2022/0094319 A1 * | 3/2022 | Majima ................... H03G 3/30 |

FOREIGN PATENT DOCUMENTS

| | | |
|---|---|---|
| JP | 2017-022889 A | 1/2017 |
| JP | 2017-143599 A | 8/2017 |
| JP | 2019-004686 A | 1/2019 |
| WO | 2015/166523 A1 | 11/2015 |

* cited by examiner

CURRENT DETECTING CIRCUIT, CURRENT DETECTING SYSTEM, AND POWER SOURCE CIRCUIT

CROSS-REFERENCE TO RELATED APPLICATIONS

This application is based upon and claims the benefit of priority from Japanese Patent Application No. 2020-159320, filed on Sep. 24, 2020; the entire contents of which are incorporated herein by reference.

FIELD

Embodiments described herein relate generally to a current detecting circuit, a current detecting system, and a power source circuit.

BACKGROUND

Conventionally, there has been disclosed a semiconductor device obtained by cascode-connecting a normally-ON switching element and a normally-OFF switching element. For example, a normally-ON switching element is constituted of a transistor whose material is gallium nitride (GaN) or silicon carbide (SiC). A normally-ON switching element made from GaN or SiC has a high withstand voltage and a low loss, and thus is preferable for applying it to a power source circuit that outputs a high voltage. On the other hand, when a normally-ON switching element is provided, there presents a case where an output current from a semiconductor device is not precisely detected in response to leakage current from the normally-ON switching element, for example. For example, in an AC/DC converter that converts an alternating-current voltage into a direct-current voltage, a phase of an output current is matched with a phase of an input voltage so as to increase a power factor, and thus there is desired a configuration including a current detecting circuit that is capable of precisely detecting the output current. There are desired a current detecting circuit and a current detecting system capable of precisely detecting an output current and having a high reliability, and a power source circuit including the current detecting circuit that is capable of precisely detecting the output current, while taking advantage of features of a semiconductor device including a normally-ON switching element.

DETAILED DESCRIPTION

According to an embodiment, a current detecting circuit including: a normally-ON type first switching element that includes a source, a drain, and a gate; a normally-OFF type second switching element that includes a drain connected to the source of the first switching element, a source connected to a reference electric potential, and a gate; a normally-OFF type third switching element that includes a source connected to the source of the second switching element, a drain connected to a current source whose current value changes in response to a control signal, and a gate to which a voltage applied to the gate of the second switching element is applied at a current detection time; and a comparison circuit configured to: compare a drain voltage of the second switching element and a drain voltage of the third switching element with each other; and output a detection signal.

Exemplary embodiments of a current detecting circuit, a current detecting system, and a power source circuit will be explained below in detail with reference to the accompanying drawings. The present invention is not limited to the following embodiments.

First Embodiment

Figure 1:
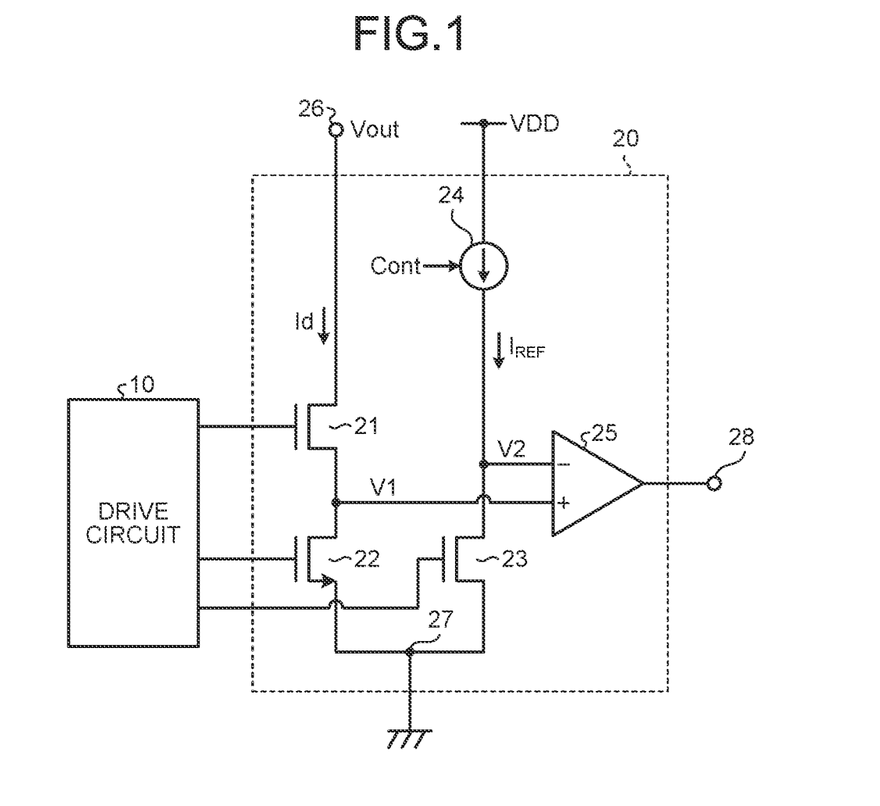
FIG. 1 is a diagram illustrating a current detecting circuit according to a first embodiment.

FIG. 1 is a diagram illustrating a current detecting circuit according to a first embodiment. In the present embodiment, there are provided a drive circuit 10 and a current detecting circuit 20. The current detecting circuit 20 includes a normally-ON type switching element 21. For example, the switching element 21 is constituted of an N-channel MOS transistor whose material is GaN. For example, a main current path between a drain and a source of a MOS transistor (Hereinafter, may be referred to as GaN transistor) whose material is GaN is made from GaN.

The current detecting circuit 20 includes normally-OFF type switching elements 22 and 23. The normally-OFF type switching elements 22 and 23 are constituted of N-channel MOS transistors whose materials are Si, for example. A main current path between a drain and a source of a MOS transistor (Hereinafter, may be referred to as Si transistor) whose material is Si is made from Si, for example.

A drain of the switching element 21 is connected to a terminal 26. The terminal 26 is connected to a power source line (not illustrated) to which a voltage of 600 V is applied via a load (not illustrated), for example. A source of the switching element 21 is connected to a drain of the switching element 22.

A source of the switching element 22 is connected to a terminal 27. In other words, a drain/source path that is a main current path of the switching element 22 is connected in series with a drain/source path of a main current path of the switching element 21. The ground potential is supplied to the terminal 27, for example.

A source of the switching element 23 is connected to a source of the switching element 22, a drain of the switching element 23 is connected to a current source 24 that supplies a reference current $I_{REF}$. A current value of the reference current $I_{REF}$ of the current source 24 is controlled by a current controlling signal Cont. A power-source voltage VDD is applied to the other end of the current source 24.

The switching elements 22 and 23 are formed on a common semiconductor substrate (not illustrated). When they are formed on a common semiconductor substrate, element characteristics of both of them are able to be matched with each other. Even if there presents variation in manufacturing, element characteristics of the switching elements 22 and 23 similarly fluctuate. For example, if element characteristics of the switching element 22 fluctuate so as to increase an ON resistance of the switching element 22, element characteristics of the switching element 23 similarly fluctuate so as to increase an ON resistance of the switching element 23.

Sizes of the switching elements 22 and 23 are set such that gate lengths thereof are the same to each other and gate widths have a dimensional ratio of n to m. According to the dimensional ratio, a ratio of an ON resistance Ron2 of the switching element 22 to an ON resistance Ron3 of the switching element 23 is indicated by the following formula (1).

$$Ron2: Ron3=1/n: 1/m \quad (1)$$

Drain voltages V1 and V2 of the switching elements 22 and 23 are indicated by the following formulae (2) and (3). The drain voltages V1 and V2 with reference to zero (0) V that is the ground potential applied to the terminal 27 are indicated. The same applies hereinafter.

$$V1=Ron2 \times Id \quad (2)$$

$$V2=Ron3 \times I_{REF} \quad (3)$$

Herein, Id indicates a drain current Id flowing through the switching element 21. Current flowing through the switching element 22 is substantially the same as current flowing through the switching element 21, and thus current flowing through the switching element 22 is current substantially the same as an output current Id. Hereinafter, for convenience of explanation, the drain current Id of the switching element 21 may be used as the output current Id.

The drain voltage V1 of the switching element 22 is supplied to a non-inversion input end (+) of a comparison circuit 25, and the drain voltage V2 of the switching element 23 is supplied to an inversion input end (−). When the drain voltage V1 of the switching element 22 is higher than the drain voltage V2 of the switching element 23, the comparison circuit 25 outputs an H-level detection signal to an output end 28. In other words, according to relation of the formulae (2) and (3), when $Ron2 \times Id > Ron3 \times I_{REF}$ is satisfied, the comparison circuit 25 outputs an H-level detection signal. By the H-level detection signal of the comparison circuit 25, there is detected that the output current Id reaches the reference current $I_{REF}$.

For example, according to setting of a value of maximum current $I_{MAX}$ within the tolerated output current Id, a value of the reference current $I_{REF}$, and a dimensional ratio of m to n between the switching elements 22 and 23, it is possible to detect, by a detection signal of the comparison circuit 25, that the output current Id is in a state of over current exceeding the maximum current $I_{MAX}$. When a configuration is employed that supplies, to the drive circuit 10, a detection signal of the comparison circuit 25 indicating that the output current Id goes into a state of over current exceeding the maximum current $I_{MAX}$ so as to turn OFF the switching elements 21 and 22, it is possible to prevent the switching elements 21 and 22 from going into an overcurrent state.

The drive circuit 10 generates drive signals for controlling turning ON/OFF of the switching elements 21, 22, and 23, and supplies the generated drive signals to respective gates thereof. For example, the drive circuit 10 applies to a gate of the switching element 22, at a current detection time point, a voltage that is equal to a voltage applied to a gate of the switching element 23, so as to turn ON the switching element 22. When a voltage between a gate and a source of each of the switching elements 22 and 23 in turning ON the switching elements 22 and 23 is equalized so as to set a ratio of an ON resistance between the switching elements 22 and 23 to a dimensional ratio between gate widths thereof, the output current Id is able to be precisely detected with high accuracy by using a ratio between the ON resistances Ron2 and Ron3 and a value of the reference current $I_{REF}$ of the current source 24.

Note that a gate of the switching element 21 may be connected to the source of the switching element 22, and the drive circuit 10 may supply, to a gate of the switching element 22, a drive signal having a voltage equal to a voltage of a signal applied to a gate of the switching element 23 at a current detection time point.

According to the first embodiment, a value of the reference current $I_{REF}$ of the current source 24 is changed by the current controlling signal Cont, and the drain voltages V1 and V2 of the switching elements 22 and 23 are compared by the comparison circuit 25. An H-level detection signal of the comparison circuit 25 indicates that the output current Id reaches the reference current $I_{REF}$. Thus, when a value of the reference current $I_{REF}$ is a target value, an H-level detection signal of the comparison circuit 25 indicates that the output current Id reaches the target current value.

A value of the output current Id is detected by a value of the reference current $I_{REF}$ when a detection signal becomes an H level. Thus, when the reference current $I_{REF}$ is changed, a current detecting circuit that detects a value of the output current Id is provided. Note that when the switching elements 21 and 22 are in an ON state, an output voltage Vout of the terminal 26 has a value of sum of voltage drops in ON resistances of the switching elements 21 and 22 which are generated by the output current Id. Thus, a value of the output current Id indicated by the reference current $I_{REF}$ is able to be used as data indicating the output voltage Vout of the terminal 26.

Figure 2:
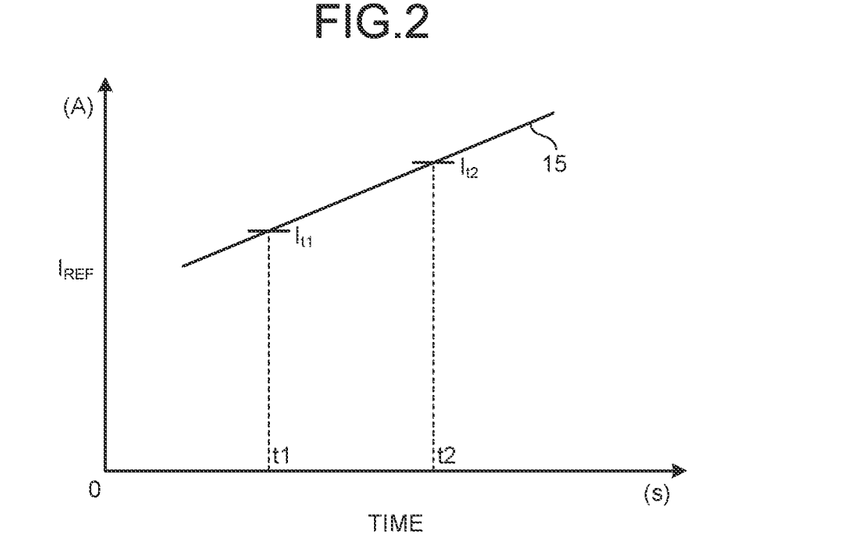
FIG. 2 is a diagram illustrating operation of the current detecting circuit according to the first embodiment.

Operations according to the first embodiment will be explained with reference to FIG. 2. In FIG. 2, a lateral axis indicates time, and a vertical axis indicates the reference current $I_{REF}$. A solid line 15 indicates the reference current $I_{REF}$. A value of the reference current $I_{REF}$ is increased in accordance with time by the current controlling signal Cont. When a detection signal of the comparison circuit 25 is an H level at a timing t1, it is detected that a value of the output current Id is a value $I_{t1}$ of the reference current $I_{REF}$ at that time. When a detection signal of the comparison circuit 25 is an H level at a timing t2, it is detected that a value of the output current Id is a value $I_{t2}$ of the reference current $I_{REF}$ at that time.

Second Embodiment

Figure 3:
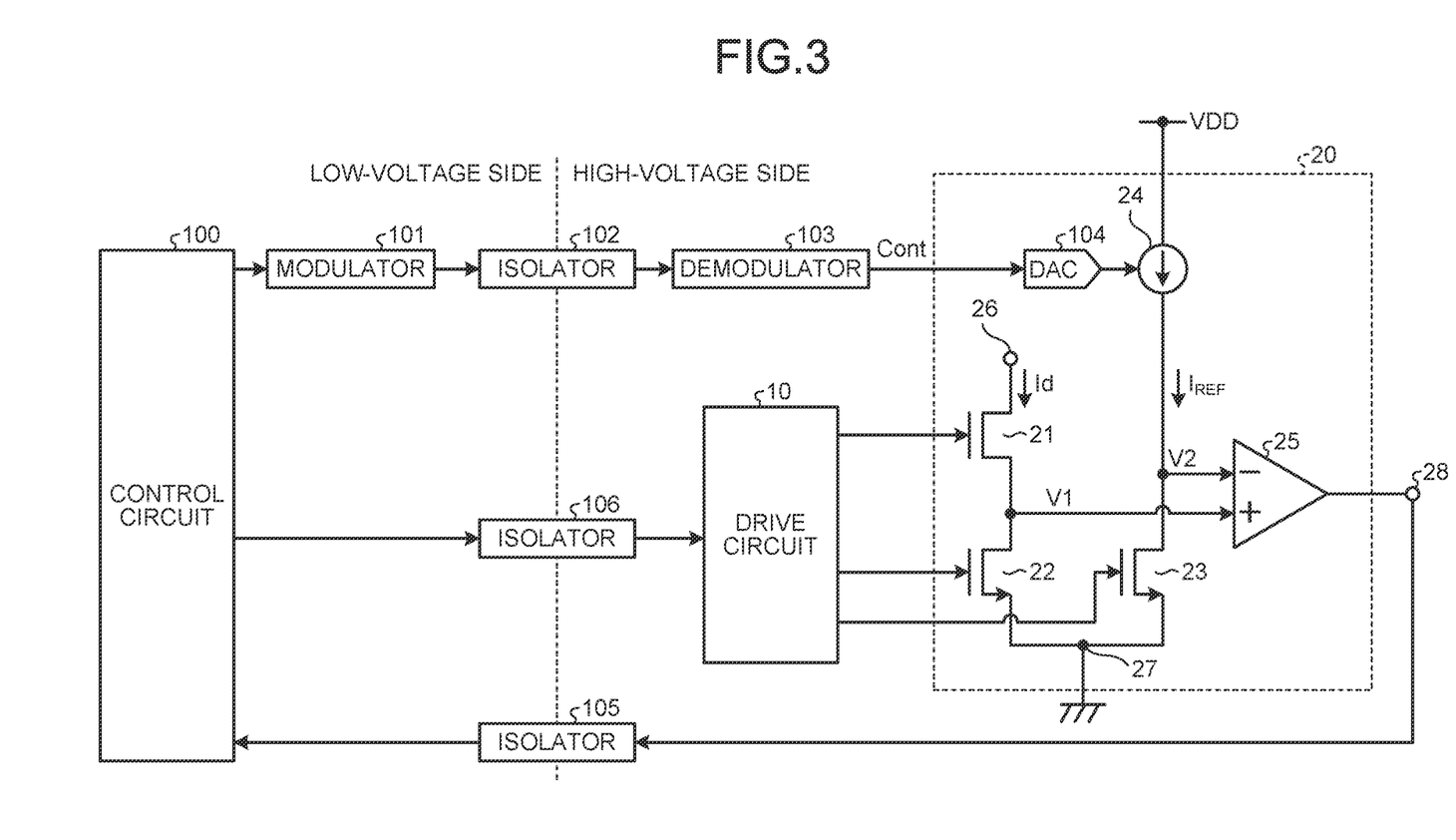
FIG. 3 is a diagram illustrating a configuration of a current detecting system according to a second embodiment.

FIG. 3 is a diagram illustrating a configuration of a current detecting system according to a second embodiment. Configuration corresponding to the above-mentioned embodiment is provided with the same reference symbols, and duplicated explanation is appropriately omitted. The same applies hereinafter. In the present embodiment, a control circuit 100, a modulator 101, a demodulator 103, and isolators 102, 105, and 106 are provided. The current detecting circuit 20 includes a DA converter 104 and the current source 24. The DA converter 104 and the current source 24 are separately indicated; however, the DA converter 104 and the current source 24 cooperate so as to constitute a single current source. A specific configuration example of the current source will be mentioned later.

The control circuit 100 generates basic data for controlling the reference current $I_{REF}$ of the current source 24, and supplies the generated data to the modulator 101. The basic data are digital signal data that indicate an amplitude value corresponding to a sine wave, for example. The basic data may be approximated to a sine wave by an approximate curve using a constant function (Y=C) with the use of a constant number, a linear function (Y=a×X+b) with the use of a variable number, and the like. When a degree of the approximate curve is increased, basic data approximated to a sine wave is able to be obtained. The control circuit 100 discretely outputs basic data in accordance with ON/OFF switching operation of the switching elements 21, 22, and 23, for example. When the basic data are discretely output, a data amount is able to be reduced.

The modulator 101 generates a modulation signal obtained by encoding a digital signal transmitted from the control circuit 100 with the use of Manchester code and the like. The modulation signal of the modulator 101 is supplied to the isolator 102. The isolator 102 is constituted of a transformer, a photo coupler, a capacity, and the like. The isolator 102 electrically insulates a low-voltage side including the control circuit 100 that is biased by a low voltage of approximately 5 V, for example, and a high-voltage side to which a high voltage exceeding 400 V is applied, for example, from each other. Each of the isolators 105 and 106 may have a configuration similar to that of the isolator 102.

The demodulator 103 demodulates a modulation signal supplied from the isolator 102, and generates the current controlling signal Cont so as to supply the generated signal to the DA converter 104. The DA converter 104 converts the current controlling signal Cont into an analog signal, and supplies the converted signal to the current source 24. The current source 24 outputs, in cooperation with the DA converter 104, the reference current $I_{REF}$ that changes in accordance with the current controlling signal Cont.

The comparison circuit 25 compares the drain voltage V1 of the switching element 22 and the drain voltage V2 of the switching element 23 with each other, and outputs a detection signal of an H level or an L level in accordance with the comparison result. The detection signal is supplied to the isolator 105. The isolator 105 supplies, to the control circuit 100, a signal responding to the detection signal. The control circuit 100 detects, by using the signal transmitted from the isolator 105, whether or not the output current Id reaches the reference current $I_{REF}$.

The control circuit 100 supplies a control signal to the drive circuit 10 via the isolator 106. The control signal supplied to the drive circuit 10 is a PWM control signal, for example. The drive circuit 10 adjusts, in response to the PWM control signal, duty ratios of drive signals to be supplied to the switching elements 21, 22, and 23.

According to the present embodiment, the reference current $I_{REF}$ is changed on the basis of basic data of the control circuit 100, and the drain voltage V1 of the switching element 22 generated by the output current Id and the drain voltage V2 of the switching element 23 generated by the reference current $I_{REF}$ are compared with each other. An H-level detection signal of the comparison circuit 25 indicates that the drain voltage V1 reaches the drain voltage V2, and thus it is detected that the output current Id reaches the reference current $I_{REF}$. Moreover, if the switching elements 21 and 22 are turned OFF when the output current Id reaches the reference current $I_{REF}$, it is possible to execute control for setting the reference current $I_{REF}$ to an upper limit value of the output current Id.

When a side of the control circuit 100 and a side of the current detecting circuit 20 are connected by the isolators 102, 105, and 106, it is possible to electrically insulate a low-voltage side biased by a low voltage and a high-voltage side to which a high voltage is applied. The comparison circuit 25 is provided on the high-voltage side, and a detection signal of the comparison circuit 25 is supplied to the control circuit 100 via the isolator 105. In other words, instead of data indicating a current value of the output current Id, an one-bit detection signal based on a result obtained by comparing the reference current $I_{REF}$ and the output current Id with each other is supplied to the control circuit 100. Thus, it is possible to reduce a data amount to be supplied to the control circuit 100.

It is sufficient that the isolator 105 transmits an one-bit detection signal of the comparison circuit 25, and thus the configuration is realized even with an isolator whose transmission speed is comparatively slow. The control circuit 100 determines a detection signal of the comparison circuit 25 at a timing while taking into account delay times of the isolators 102 and 105. In consideration of a timing at which basic data are output from the control circuit 100, a timing at which the output current Id and the reference current $I_{REF}$ changing on the basis of the basic data are compared with each other, and a timing at which a detection signal of the comparison circuit 25 is supplied to the control circuit 100, it is possible to precisely detect the output current Id.

Figure 4:
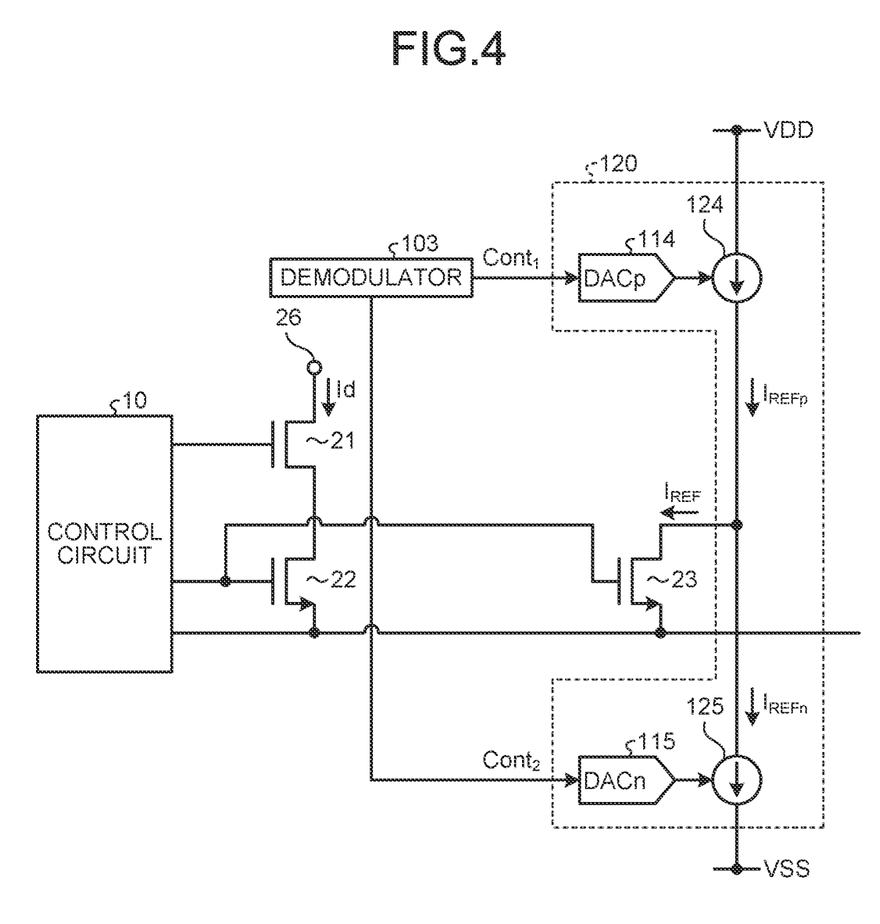
FIG. 4 is a diagram illustrating one configuration example of a current source.

FIG. 4 is a diagram illustrating one configuration example of a current source that supplies the reference current $I_{REF}$ to the switching element 23. A current source 120 includes current sources 124 and 125 that are connected to a drain of the switching element 23. The current source 124 outputs, in cooperation with a DA converter 114, a reference current $I_{REFp}$ that is controlled by a current controlling signal $Cont_1$. The current source 125 outputs, in cooperation with a DA converter 115, a reference current $I_{REFn}$ that is controlled by a current controlling signal $Cont_2$. The power-source voltage VDD supplied to one end of the current source 124 is a positive voltage with respect to a source voltage of the switching element 23, and a power-source voltage VSS supplied to one end of the current source 125 is a negative voltage with respect to the source voltage of the switching element 23.

The reference current $I_{REFn}$ of the current source 125 has a negative relation with respect to the reference current $I_{REFp}$ of the current source 124, and thus the reference current $I_{REF}$ supplied to the switching element 23 is $I_{REFp}-I_{REFn}$. Thus, when the reference currents $I_{REFp}$ and $I_{REFn}$ are controlled by the current controlling signals $Cont_1$ and $Cont_2$, a value of the reference current $I_{REF}$ to be supplied to the switching element 23 is able to be changed from a positive value to a negative value. Hence, it is possible to generate the reference current $I_{REF}$ that changes in accordance with a sine wave, for example.

Figure 5:
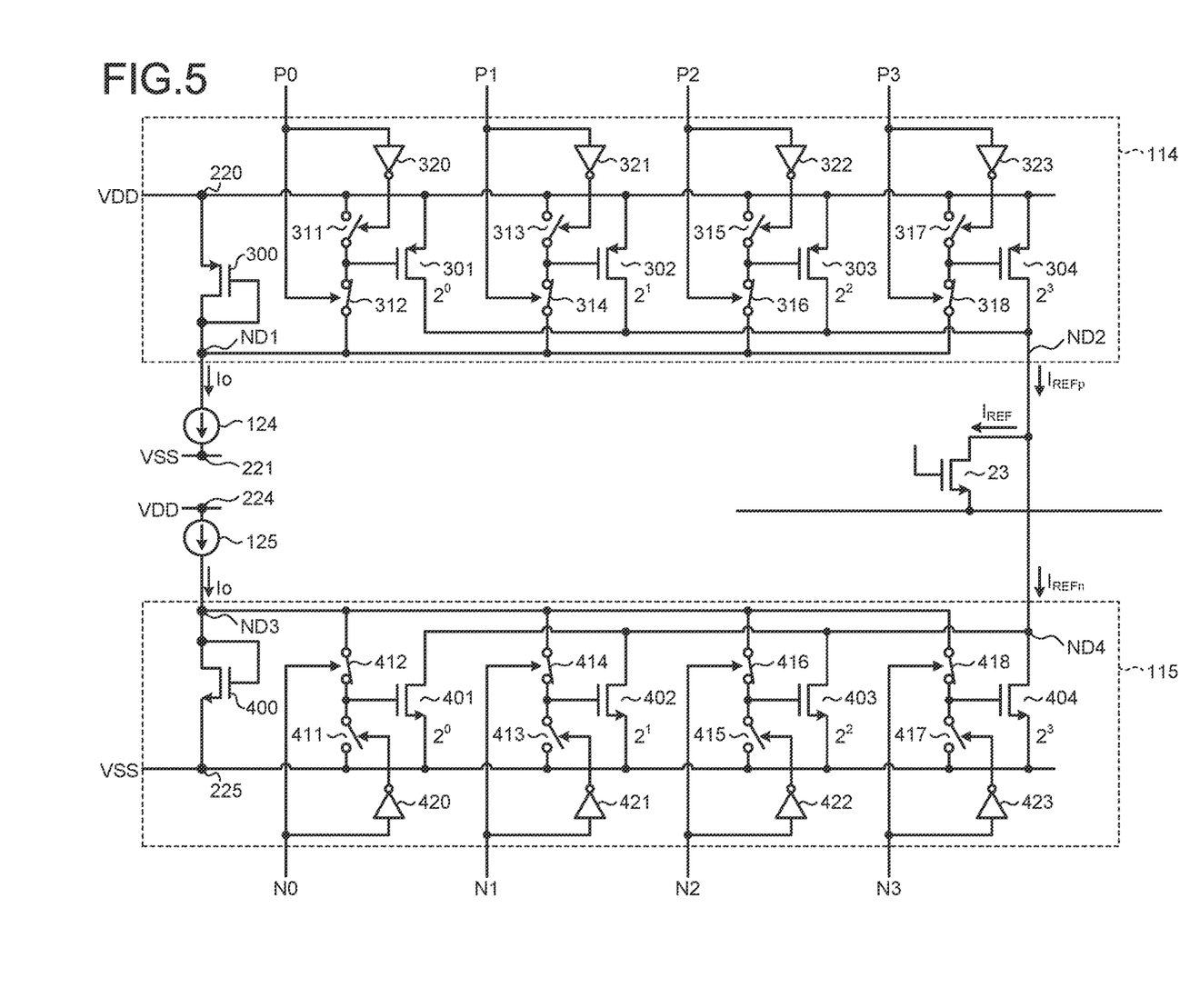
FIG. 5 is a diagram specifically illustrating a configuration example of the current source illustrated in FIG. 4.

FIG. 5 is a diagram specifically illustrating a configuration example of the current source illustrated in FIG. 4. A current source having the present configuration example includes the DA converter 114 that cooperates with the current source 124. The DA converter 114 includes a diode-connected PMOS transistor 300. A source of the PMOS transistor 300 is connected to a terminal 220 to which the power-source voltage VDD is applied, and a drain of the PMOS transistor 300 is connected to one end of the current source 124. The other end of the current source 124 is connected to a terminal 221 to which the power-source voltage VSS is applied.

The DA converter 114 includes PMOS transistors 301 to 304 that are connected in parallel between the terminal 220 and a drain of the switching element 23. Each of the PMOS transistors 301 to 304 has a size weighted by 2N with respect to the PMOS transistor 300. Specifically, the PMOS transistor 301 has a size same as a size of the PMOS transistor 300, and the PMOS transistors 302, 303, and 304 have sizes respectively weighted by $2^1$, $2^2$, and $2^3$ with respect to the size of the PMOS transistor 300.

A switch 311 is connected between a source and a gate of the PMOS transistor 301, and a switch 312 is connected between the gate of the PMOS transistor 301 and a node ND1. A control signal P0 is supplied to the switch 311 via an inverter 320, and the control signal P0 is supplied to the switch 312. When the control signal P0 is an H level, the switch 312 is in a connected state, and the PMOS transistor 301 is turned ON. Control signals P1, P2, and P3 are respectively supplied to switches 313, 315, and 317 via inverters 321, 322, and 323.

Similarly, turning ON/OFF of the PMOS transistor 302 to 304 is controlled by the control signals P1 to P3 supplied to the switches 313 to 318. Each of the PMOS transistors 301 to 304 outputs current according to weighting with respect to the PMOS transistor 300. When a combination of the PMOS transistors 301 to 304 to be turned ON by the control signals P0 to P3 is changed, a value of the reference current $I_{REFp}$ is able to be adjusted. The demodulator 103 outputs the control signals P0 to P3 as the current controlling signal $Cont_1$.

The current source having the present configuration example includes the DA converter 115 that cooperates with the current source 125. The DA converter 115 includes a diode-connected NMOS transistor 400. A source of the NMOS transistor 400 is connected to a terminal 225 to which the power-source voltage VSS is applied, and a drain of the NMOS transistor 400 is connected to one end of the current source 125. The other end of the current source 125 is connected to a terminal 224 to which the power-source voltage VDD is applied. Each of the current sources 124 and 125 is constituted of a bandgap circuit so as to output current Io, for example.

The DA converter 115 includes NMOS transistors 401 to 404 that are connected in parallel between the terminal 225 and a node ND4. Each of the NMOS transistor 401 to 404 has a size weighted by $2^N$ with respect to the NMOS transistor 400. Specifically, the NMOS transistor 401 has a size same as a size of the NMOS transistor 400, and the NMOS transistors 402, 403, and 404 have sizes respectively weighted by $2^1$, $2^2$, and $2^3$ with respect to the size of the NMOS transistor 400.

A switch 411 is connected between a source and a gate of the NMOS transistor 401, and a switch 412 is connected between the gate of the NMOS transistor 401 and a node ND3. A control signal N0 is supplied to the switch 411 via an inverter 420, and the control signal N0 is supplied to the switch 412. When the control signal N0 is an H level, the switch 412 is turned ON, and the NMOS transistor 401 is turned ON. Control signals N1, N2, and N3 are respectively supplied to switches 413, 415, and 417 via inverters 421, 422, and 423.

Similarly, turning ON/OFF of the NMOS transistors 402 to 404 is controlled by the control signals N1 to N3 supplied to the switches 413 to 418. Each of the NMOS transistors 401 to 404 outputs current according to weighting with respect to the NMOS transistor 400. When a combination of the NMOS transistors 401 to 404 to be turned ON by the control signals N0 to N3 is changed, a value of the reference current $I_{REFn}$ is able to be adjusted. The demodulator 103 outputs the control signals N0 to N3 as the current controlling signal $Cont_2$. The current source according to the present configuration example is capable of supplying current according to the current controlling signals $Cont_1$ and $Cont_2$.

Figure 6:
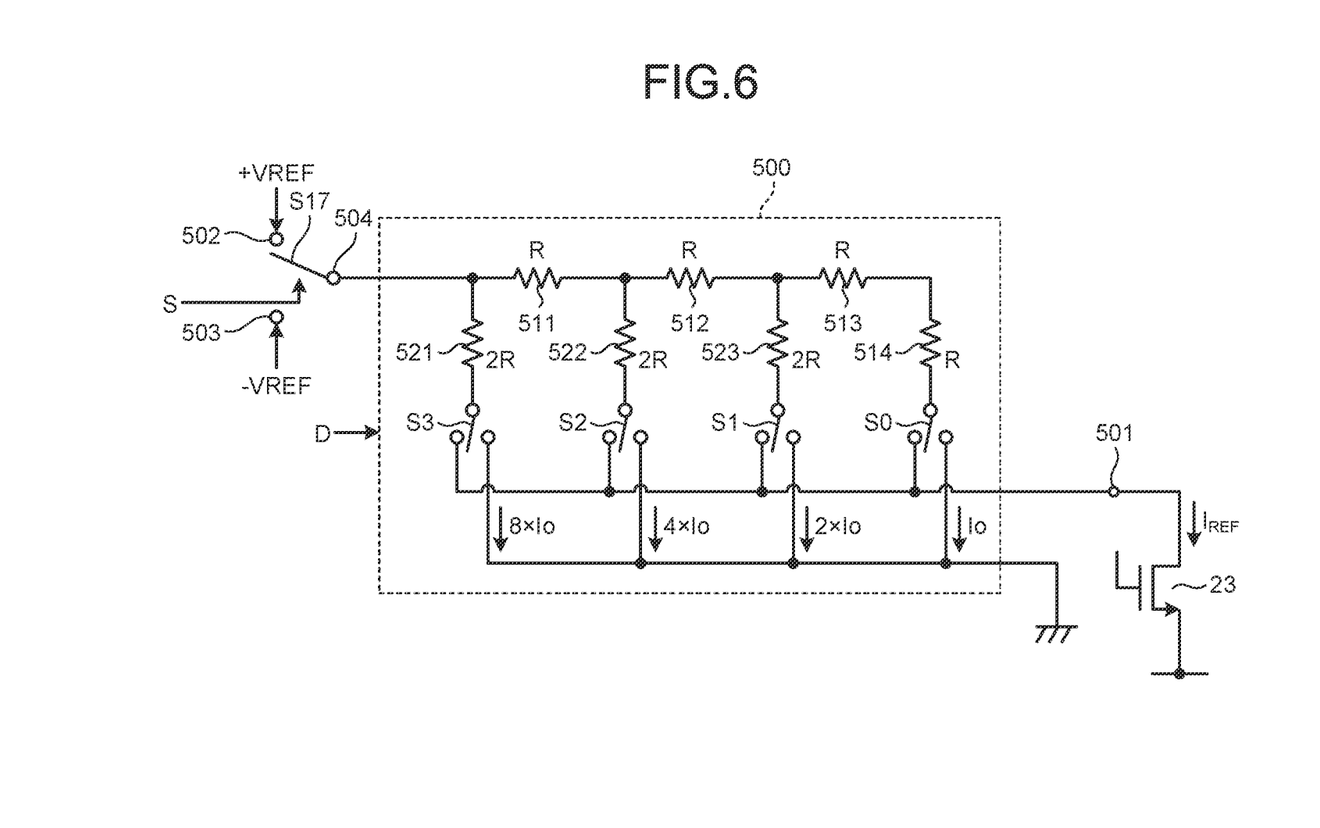
FIG. 6 is a diagram specifically illustrating another configuration example of the current source.

FIG. 6 is a diagram specifically illustrating another configuration example of the current source. A current source according to the present embodiment includes a resistor ladder circuit 500 that is constituted of an R-2R ladder resistor circuit. The resistor ladder circuit 500 includes resistors 511 to 514 each having a resistance value R and resistors 521 to 523 each having a resistance value 2R that is twice as large as the resistance value R. With respect to the current Io flowing through the right-end resistor 514, current flowing through the adjacent resistor 523 is 2×Io. Similarly, current flowing through the resistor 522 is 4×Io, and current flowing through the resistor 521 is 8×Io. When connection destinations of switches S0 to S3 are changed in accordance with a control signal D so as to change a combination of currents supplied to an output terminal 501, a value of the reference current $I_{REF}$ to be output from the output terminal 501 is able to be adjusted.

A connection destination of an input terminal 504 of the resistor ladder circuit 500 is switched, by a switch S17 that is controlled by a switching signal S, between a terminal 502 to which +VREF is applied and a terminal 503 to which −VREF is applied. When a voltage to be applied to the input terminal 504 is switched between +VREF and −VREF, the reference current $I_{REF}$ is able to be changed from a positive value to a negative value. Thus, it is possible to constitute a current source that supplies the reference current $I_{REF}$ corresponding to a sine wave that changes from a positive current value to a negative current value. The control signal D and the switching signal S are supplied from the demodulator 103 as the current controlling signals $Cont_1$ and $Cont_2$, for example. The current source according to the present configuration example is capable of supplying current according to the current controlling signals $Cont_1$ and $Cont_2$.

Third Embodiment

Figure 7:
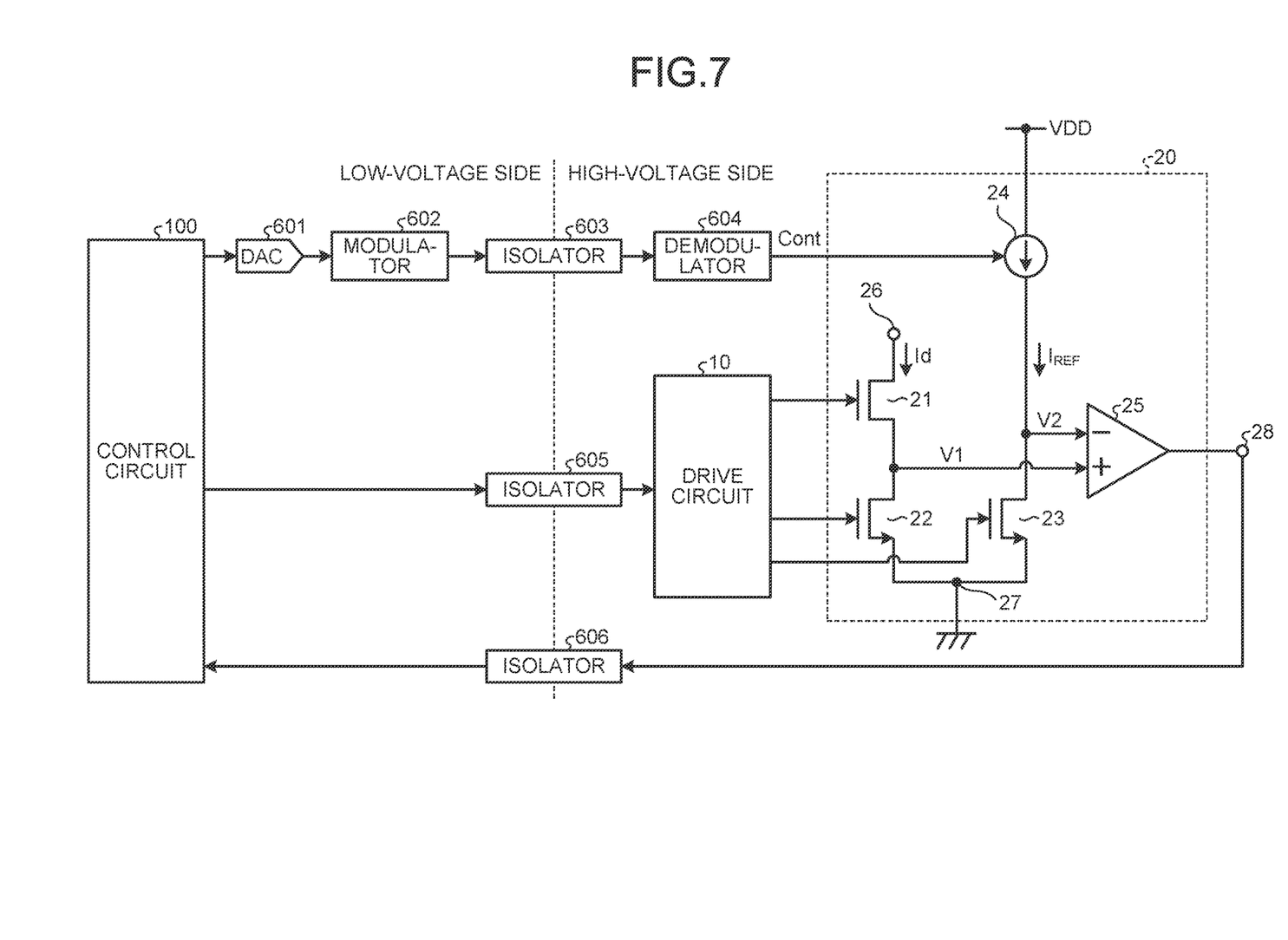
FIG. 7 is a diagram illustrating a current detecting system according to a third embodiment.

FIG. 7 is a diagram illustrating a current detecting system according to a third embodiment. In the present embodiment, a DA converter 601, a modulator 602, an isolator 603, and a demodulator 604 are provided. The DA converter 601 converts a digital signal of the control circuit 100 into an analog signal, and supplies the converted signal to the modulator 602. The modulator 602 is constituted of an AM modulator and an FSK modulator, for example. An output signal of the modulator 602 is supplied to the isolator 603. An output signal of the isolator 603 is supplied to the demodulator 604. The demodulator 604 is constituted in correspondence with the modulator 602. For example, when the modulator 602 is an AM modulator, the demodulator 604 is constituted of an AM demodulator. The demodulator 604 generates the current controlling signal Cont, and supplies the generated signal to the current source 24. The current source 24 generates the reference current $I_{REF}$ that changes in accordance with the current controlling signal Cont. For example, it is possible to realize a configuration for controlling a gate voltage of a MOS transistor (not illustrated)

constituting the current source 24 by using the current controlling signal Cont so as to change the reference current $I_{REF}$ in an analog manner.

A detection signal of the comparison circuit 25 that compares the drain voltage V1 of the switching element 22 and the drain voltage V2 of the switching element 23 with each other is supplied to the control circuit 100 via an isolator 606. The control circuit 100 supplies a control signal to the drive circuit 10 via an isolator 605.

In the present embodiment, analog conversion is performed on basic data transmitted from the control circuit 100 by the DA converter 601, and the converted data are supplied to a high-voltage side via the isolator 603. It is sufficient that the isolator 603 supplies an analog signal to the high-voltage side as it is, so that it is possible to configure the isolator 603 having a comparatively narrow frequency band. The comparison circuit 25 that compares the drain voltage V1 of the switching element 22 and the drain voltage V2 of the switching element 23 with each other is provided on a high-voltage side, and a detection signal thereof is supplied to the control circuit 100 via the isolator 606. The detection signal of the comparison circuit 25 is an one-bit digital signal that is based on a comparison result between the drain voltage V1 of the switching element 22 and the drain voltage V2 of the switching element 23. Thus, the isolator 606 that transmits a detection signal of the comparison circuit 25 is able to be constituted of an isolator whose transmission speed is comparatively slow.

Fourth Embodiment

Figure 8:
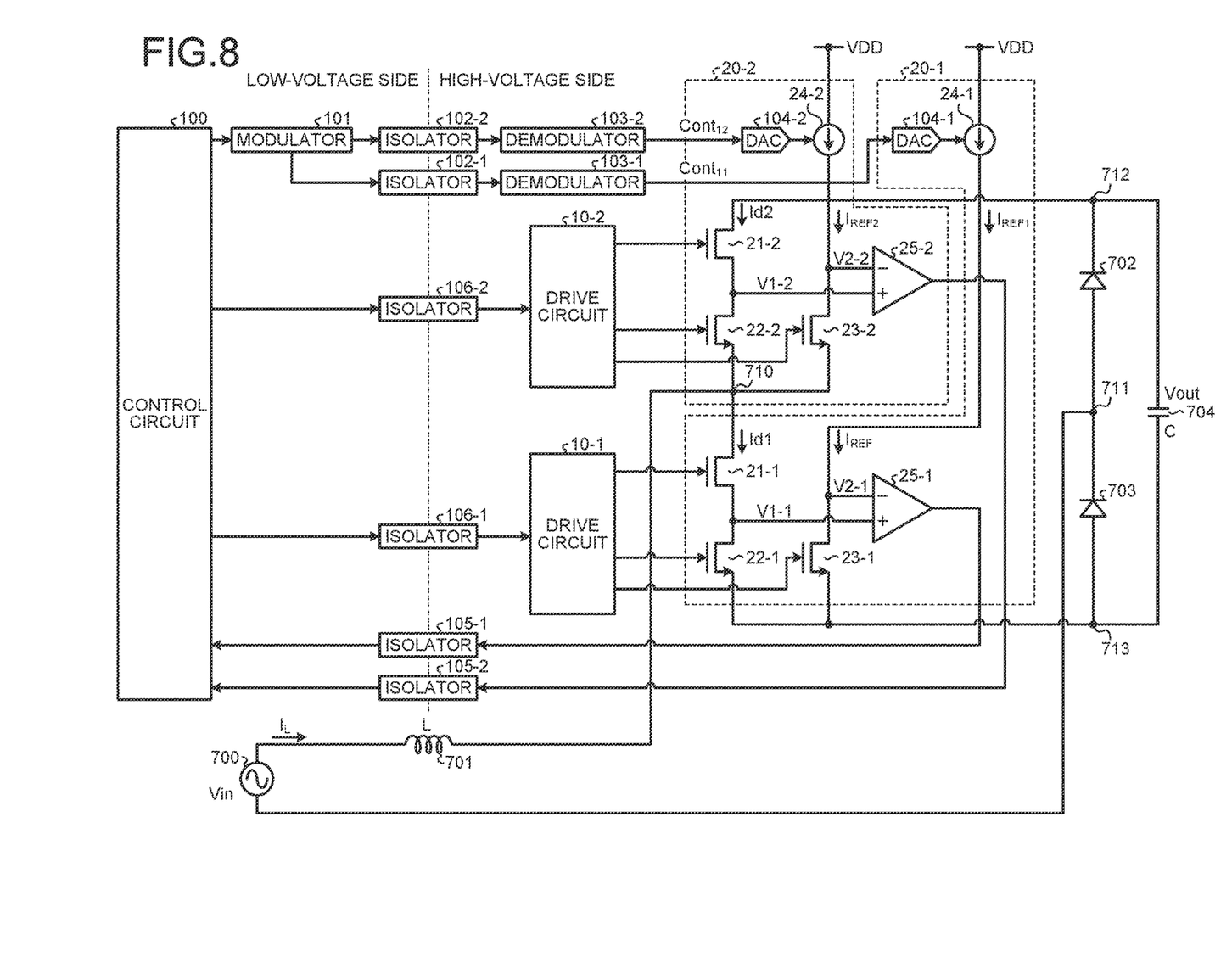
FIG. 8 is a diagram illustrating a power source circuit according to a fourth embodiment.

FIG. 8 is a diagram illustrating a power source circuit according to a fourth embodiment. In the present embodiment, an AC/DC converter that converts an Alternating-Current voltage into a Direct-Current voltage is configured. In the present embodiment, current detecting circuits 20-1 and 20-2, and a capacitor 704 and diodes 702 and 703 that are connected between output terminals 712 and 713 are provided. An AC power supply 700 and a boost inductor 701 are connected between input terminals 710 and 711. The diode 702 is connected in a forward direction from the input terminal 711 toward the output terminal 712, and the diode 703 is connected in a forward direction from the output terminal 713 toward the input terminal 711.

In the current detecting circuit 20-1, a comparison circuit 25-1 compares a drain voltage V1-1 of a normally-OFF type switching element 22-1 and a drain voltage V2-1 of a normally-OFF type switching element 23-1 with each other so as to detect an output current Id1 flowing through a normally-ON type switching element 21-1 and the normally-OFF type switching element 22-1. A current source 24-1 that supplies a reference current $I_{REF1}$ to the switching element 23-1 is controlled by a current controlling signal $Cont_{11}$ supplied to a DA converter 104-1.

In the current detecting circuit 20-2, a comparison circuit 25-2 compares a drain voltage V1-2 of a normally-OFF type switching element 22-2 and a drain voltage V2-2 of a normally-OFF type switching element 23-2 with each other so as to detect an output current Id2 flowing through a normally-ON type switching element 21-2 and the normally-OFF type switching element 22-2. A current source 24-2 that supplies a reference current $I_{REF2}$ to the switching element 23-2 is controlled by a current controlling signal $Cont_{12}$ supplied to a DA converter 104-2. Detection signals of the comparison circuits 25-1 and 25-2 are respectively supplied to the control circuit 100 via isolators 105-1 and 105-2.

The control circuit 100 supplies, to the modulator 101, a digital signal of basic data for controlling the reference currents $I_{REF1}$ and $I_{REF2}$. The basic data include a digital signal that is generated on the basis of a sine wave of the AC power supply 700, for example. The modulator 101 generates a modulation signal obtained by encoding a digital signal transmitted from the control circuit 100 with the use of Manchester code and the like, and supplies the generated signal to demodulators 103-1 and 103-2 via isolators 102-1 and 102-2. The demodulators 103-1 and 103-2 generate the current controlling signals $Cont_{11}$ and $Cont_{12}$, and supplies the generated signals to the DA converters 104-1 and 104-2. The current sources 24-1 and 24-2 outputs the reference currents $I_{REF1}$ and $I_{REF2}$ in cooperation with the DA converters 104-1 and 104-2.

The switching elements 21-1, 22-1, and 23-1 of the current detecting circuit 20-1 are driven by a drive circuit 10-1, and the switching elements 21-2, 22-2, and 23-2 of the current detecting circuit 20-2 are driven by a drive circuit 10-2. The control circuit 100 generates a control signal in response to detection signals transmitted form the comparison circuits 25-1 and 25-2, and supplies the generated signal to the drive circuits 10-1 and 10-2.

In response to a control signal transmitted from the control circuit 100, the drive circuits 10-1 and 10-2 control turning ON/OFF of the switching elements 21-1 and 22-1 of the current detecting circuit 20-1 and the switching elements 21-2 and 22-2 of the current detecting circuit 20-2. Inductor current $I_L$ becomes the output current Id1 flowing through the switching elements 21-1 and 22-1 of the current detecting circuit 20-1 and the output current Id2 flowing through the switching elements 21-2 and 22-2 of the current detecting circuit 20-2. The switching elements 21-1 and 22-1 of the current detecting circuit 20-1 and the switching elements 21-2 and 22-2 of the current detecting circuit 20-2 are alternately turned ON/OFF, and the capacitor 704 is charged by the output voltage Vout whose positive side is the output terminal 712 and whose negative side is the output terminal 713.

Figure 9A:
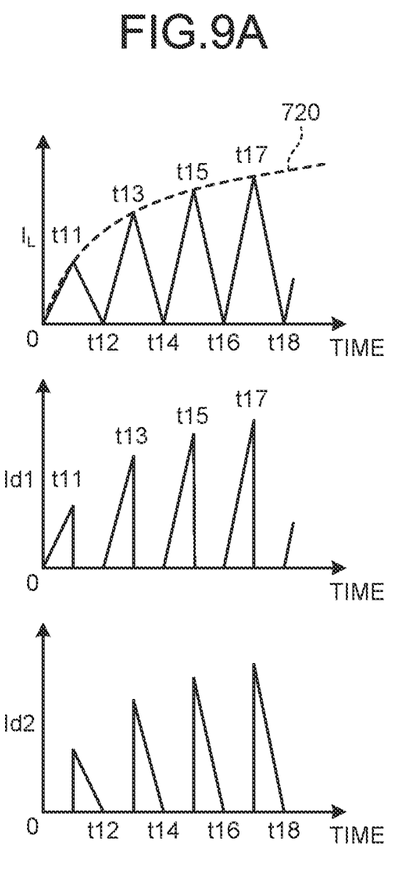
FIGS. 9A and 9B are diagrams illustrating operation of a power source circuit according to the fourth embodiment.

Operation according to the fourth embodiment will be explained with reference to FIGS. 9A and 9B. FIG. 9A indicates a case where an input voltage Vin is positive, namely, a voltage on a side of the input terminal 710 is higher than a voltage on a side of the input terminal 711. A lateral axis indicates time. An upper part indicates the inductor current $I_L$, a middle part indicates the output current Id1 flowing through the switching elements 21-1 and 22-1 of the current detecting circuit 20-1, and a lower part indicates the output current Id2 flowing through the switching elements 21-2 and 22-2 of the current detecting circuit 20-2. A dashed line 720 illustrated in the upper part of FIG. 9A indicates the reference current $I_{REF1}$ that is generated by basic data on a sine wave supplied from the control circuit 100.

In a state where the input voltage Vin is positive, the current controlling signal $Cont_{11}$ is generated such that the reference current $I_{REF1}$ of the current source 24-1 in the current detecting circuit 20-1 is a value corresponding to the sine wave. At timings t11, t13, t15, and t17 at each of which the output current Id1 flowing through the switching elements 21-1 and 22-1 reaches the reference current $I_{REF1}$, the switching elements 21-1 and 22-1 are turned OFF and the switching elements 21-2 and 22-2 of the current detecting circuit 20-2 are turned ON.

In a state where the input voltage Vin is positive, the reference current $I_{REF2}$ of the current source 24-2 is set to zero by the current controlling signal $Cont_{12}$. At timings t12, t14, t16, and t18 at each of which the output current Id2 flowing through the switching elements 21-2 and 22-2 of the current detecting circuit 20-2 is zero, the switching elements 21-2 and 22-2 of the current detecting circuit 20-2 are turned OFF and the switching elements 21-1 and 22-1 of the current detecting circuit 20-1 are turned ON.

When turning ON/OFF of the switching elements 21-1, 22-1, 21-2, and 22-2 of the current detecting circuit 20-1 and 20-2 is controlled at the timings t11, t13, t15, and t17 at each of which the output current Id1 flowing through the switching elements 21-1 and 22-1 of the current detecting circuit 20-1 reaches the reference current $I_{REF1}$, an upper limit value of the output current Id1, accordingly, the inductor current $I_L$ is able to be controlled by basic data based on a sine wave supplied by the control circuit 100. In other words, an envelope of the inductor current $I_L$ is able to be matched with a sine wave of the AC power supply 700.

Figure 9B:
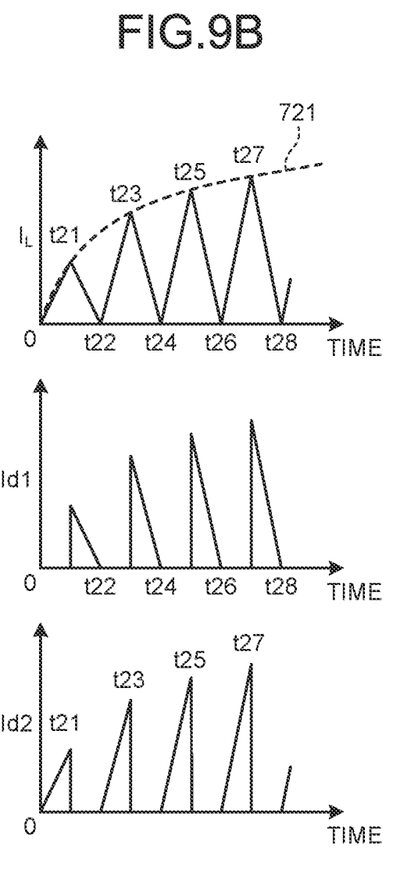

FIG. 9B indicates a case where the input voltage Vin is negative, namely, a voltage on a side of the input terminal 711 is higher than a voltage on a side of the input terminal 710. When the input voltage Vin is inverted, a direction of the inductor current $I_L$ is accordingly inverted, for convenience of explanation, an upper side is indicated as positive. A dashed line 721 illustrated in the upper part of FIG. 9B indicates the reference current $I_{REF2}$ that is output from the current source 24-2 by basic data on a sine wave supplied from the control circuit 100. A lateral axis indicates time. An upper part of FIG. 9B indicates the inductor current $I_L$, a middle part indicates the output current Id1 flowing through the switching elements 21-1 and 22-1 of the current detecting circuit 20-1, and a lower part indicates the output current Id2 flowing through the switching elements 21-2 and 22-2 of the current detecting circuit 20-2.

In a state where the input voltage Vin is negative, the current controlling signal $Cont_{12}$ is generated such that the reference current $I_{REF2}$ of the current source 24-2 in the current detecting circuit 20-2 is a value corresponding to the sine wave. At timings t21, t23, t25, and t27 at each of which the output current Id2 flowing through the switching elements 21-2 and 22-2 reaches the reference current $I_{REF2}$, the switching elements 21-2 and 22-2 of the current detecting circuit 20-2 are turned OFF and the switching elements 21-1 and 22-1 of the current detecting circuit 20-1 are turned ON.

In a state where the input voltage Vin is negative, the reference current $I_{REF1}$ of the current source 24-1 is set to zero by the current controlling signal $Cont_{11}$. At timings t22, t24, t26, and t28 at each of which the output current Id1 flowing through the switching elements 21-1 and 22-1 of the current detecting circuit 20-1 is zero, the switching elements 21-1 and 22-1 of the current detecting circuit 20-1 are turned OFF and the switching elements 21-2 and 22-2 of the current detecting circuit 20-2 are turned ON.

At timings t21, t23, t25, and t27 at each of which the output current Id2 flowing through the switching elements 21-2 and 22-2 of the current detecting circuit 20-2 reaches the reference current $I_{REF2}$, turning ON/OFF of the switching elements 21-1 and 22-1 of the current detecting circuit 20-1 and the switching elements 21-2 and 22-2 of the current detecting circuit 20-2 are controlled, a lower limit value of the output current Id2, accordingly, the inductor current $I_L$ is able to be controlled by basic data based on a sine wave supplied by the control circuit 100. In other words, an envelope of the inductor current $I_L$ is able to be matched with a sine wave of the AC power supply 700.

According to the present embodiment, the inductor current $I_L$ is controlled by the reference currents $I_{REF1}$ and $I_{REF2}$ that are generated in accordance with basic data based on a sine wave of the AC power supply 700 output from the control circuit 100. Thus, an envelope of the inductor current $I_L$ is able to be matched with a sine wave of the AC power supply 700. In other words, a phase of the input voltage Vin and a phase of an output current are matched with each other, so that it is possible to improve a power factor of a power source circuit. The output currents Id1 and Id2 are detected by the current detecting circuits 20-1 and 20-2 to be able to detect the inductor current $I_L$, and thus there presents no need for additionally providing a circuit for detecting the inductor current $I_L$. Moreover, the isolators 102-1, 102-2, 105-1, 105-2, 106-1, and 106-2 are arranged between a low-voltage side on which the control circuit 100 is provided and a high-voltage side to which the input voltage Vin is applied, it is possible to connect the low-voltage side and the high-voltage side while electrically insulating them from each other. Detection signals of the comparison circuits 25-1 and 25-2 are one-bit signals indicating comparison result between the drain voltage V1-1 and the drain voltage V2-1 and comparison result between the drain voltage V1-2 and the drain voltage V2-2, which are output at each switching cycle of the switching elements 21-1, 22-1, 21-2, and 22-2, and thus each of the isolators 105-1 and 105-2 is constituted of an isolator whose transmission speed is comparatively slow.

The normally-ON type switching element may be constituted of a Junction Field Effect Transistor (JFET).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detecting circuit comprising:
   a normally-ON type first switching element that includes a source, a drain, and a gate;
   a normally-OFF type second switching element that includes a drain connected to the source of the first switching element, a source connected to a reference electric potential, and a gate;
   a normally-OFF type third switching element that includes a source connected to the source of the second switching element, a drain connected to a current source whose current value changes in response to a control signal, and a gate to which a voltage applied to the gate of the second switching element is applied at a current detection time; and
   a comparison circuit configured to:
      compare a drain voltage of the second switching element and a drain voltage of the third switching element with each other; and
      output a detection signal.

2. The current detecting circuit according to claim 1, wherein
   a current value of the current source changes from a positive value to a negative value.

3. The current detecting circuit according to claim 2, wherein
   the current source includes:
      a first current source that supplies a first current to the drain of the third switching element; and a second current source that supplies a second current to the drain of the third switching element.

4. The current detecting circuit according to claim 3, wherein
the first current source includes a plurality of MOS transistors that is connected in parallel between a first power-source supplying end and the drain of the third switching element, the plurality of MOS transistors having sizes to which predetermined weights are assigned.

5. The current detecting circuit according to claim 2, wherein
the current source includes a resistor ladder circuit.

6. The current detecting circuit according to claim 1, wherein
the first switching element includes a GaN transistor.

7. A current detecting system comprising:
a current detecting circuit including:
  a normally-ON type first switching element that includes a source, a drain, and a gate;
  a normally-OFF type second switching element that includes a drain connected to the source of the first switching element, a source connected to a reference electric potential, and a gate;
  a normally-OFF type third switching element that includes a source connected to the source of the second switching element, a drain connected to a current source whose current value changes in response to a control signal, and a gate to which a voltage applied to the gate of the second switching element is applied at a current detection time; and
  a comparison circuit configured to:
    compare a drain voltage of the second switching element and a drain voltage of the third switching element with each other; and
    output a detection signal;
a control circuit that generates basic data of the control signal;
a first isolator configured to:
  electrically insulate the control circuit and the current detecting circuit from each other; and
  supply a signal based on the basic data to the current detecting circuit; and
a second isolator configured to:
  electrically insulate the comparison circuit and the control circuit from each other; and
  supply the detection signal to the control circuit.

8. The current detecting system according to claim 7, wherein
a current value of the current source changes from a positive value to a negative value.

9. The current detecting system according to claim 8, wherein
the current source includes:
  a first current source that supplies a first current to the drain of the third switching element; and
  a second current source that supplies a second current to the drain of the third switching element.

10. The current detecting system according to claim 9, wherein
the first current source includes a plurality of MOS transistors that is connected in parallel between a first power-source supplying end and the drain of the third switching element, the plurality of MOS transistors having sizes to which predetermined weights are assigned.

11. The current detecting system according to claim 8, wherein
the current source includes a resistor ladder circuit.

12. The current detecting system according to claim 7, wherein
the first switching element includes a GaN transistor.

13. The current detecting system according to claim 7 further comprising:
a drive circuit configured to:
  being controlled by the control circuit; and
  supply a drive signal to the gates of the first to the third switching elements.

14. The current detecting system according to claim 13, wherein
the control circuit controls the drive circuit such that the drive circuit outputs a drive signal for turning OFF the first and the second switching elements when the drain voltage of the second switching element reaches the drain voltage of the third switching element.

15. A power source circuit comprising:
a first input terminal and a second input terminal to which an alternating-current power supply is connected;
a first output terminal and a second output terminal;
a normally-ON type first switching element that includes a drain connected to the first input terminal, a source, and a gate;
a normally-OFF type second switching element that includes a drain connected to the source of the first switching element, a source connected to the second output terminal, and a gate;
a normally-OFF type third switching element that includes a source connected to the source of the second switching element, a drain connected to a first current source whose current value changes in response to a first control signal, and a gate to which a voltage applied to the gate of the second switching element is applied at a current detection time;
a first comparison circuit that compares a drain voltage of the second switching element and a drain voltage of the third switching element with each other;
a normally-ON type fourth switching element that includes a drain connected to the first output terminal, a source, and a gate;
a normally-OFF type fifth switching element that includes a drain connected to the source of the fourth switching element, a source connected to the first input terminal, and a gate;
a normally-OFF type sixth switching element that includes a source connected to the source of the fifth switching element, a drain connected to a second current source whose current value changes in response to a second control signal, and a gate to which a voltage applied to the gate of the fifth switching element is applied at a current detection time;
a second comparison circuit that compares a drain voltage of the fifth switching element and a drain voltage of the sixth switching element with each other;
a drive circuit that generates, in response to output signals of the first comparison circuit and the second comparison circuit, a drive signal for controlling turning ON/OFF of the first to the sixth switching elements;
a first rectifier element connected between the second input terminal and the first output terminal;
a second rectifier element connected between the second input terminal and the second output terminal; and
a capacitor connected between the first output terminal and the second output terminal.

16. The power source circuit according to claim 15 further comprising:
a control circuit that generates basic data on the first control signal and the second control signal, wherein the basic data are generated based on a sine wave.

17. The power source circuit according to claim 15, wherein
the first current source includes:
a third current source that supplies a first current to the drain of the third switching element; and
a fourth current source that supplies a second current to the drain of the third switching element.

18. The power source circuit according to claim 15, wherein
the first current source includes a plurality of MOS transistors that is connected in parallel between a first power-source supplying end and the drain of the third switching element, the plurality of MOS transistors having sizes to which predetermined weights are assigned.

19. The power source circuit according to claim 15, wherein
the first current source includes a resistor ladder circuit.

20. The power source circuit according to claim 15, wherein
the first switching element includes a GaN transistor.

* * * * *